(12) United States Patent
Doros

(10) Patent No.: US 6,703,625 B1
(45) Date of Patent: Mar. 9, 2004

(54) METHODS AND APPARATUS FOR OFF-AXIS LITHOGRAPHIC ILLUMINATION

(75) Inventor: Theodore G. Doros, Sunnyvale, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/334,882

(22) Filed: Dec. 31, 2002

(51) Int. Cl.⁷ .................................................. G21G 5/00
(52) U.S. Cl. .................................. 250/492.2; 250/492.1
(58) Field of Search .......................... 250/492.1, 492.2, 250/492.22, 492.3; 359/850–867, 34, 559; 355/53, 67

(56) References Cited

U.S. PATENT DOCUMENTS

| | | | |
|---|---|---|---|
| 5,361,292 A | 11/1994 | Sweatt | 378/34 |
| 5,638,211 A | 6/1997 | Shiraishi | 359/559 |
| 6,109,756 A * | 8/2000 | Takahashi | 359/857 |
| 6,233,041 B1 | 5/2001 | Shiraishi | 355/53 |
| 6,452,662 B2 | 9/2002 | Mulkens et al. | 355/67 |
| 6,525,806 B1 * | 2/2003 | Smith | 355/71 |

OTHER PUBLICATIONS

Sewell, "The Development of Step and Scan", Semiconductor Fabtech, 9$^{th}$ Edition, pp. 193–197.

Schellenberg et al., "Adoption of OPC and the Impact on Design and Layout", Session 7–4, Design Automation Conference, Jun. 19, 2001.

Rieger et al., "Layout Design Methodologies for Sub–Wavelength Manufacturing", Website, 20 pages, (undated) http://videos.dac.com/videos/38th/7/7_3/7_3 slides.pdf.

"Lithography Stepper Optics", Website, 10 pages, (undated) http://www-inst.eecs.berkeley.edu/~ee290f/lithoslides.pdf.

Hsu et al., "Dipole Decomposition Mask–design for Full Chip Implementation at the 100nm Technology Node and Beyond", Optical Microlithography XV, Proceedings of SPIE, vol. 4691, © 2002, pp. 476–490.

* cited by examiner

Primary Examiner—John R. Lee
Assistant Examiner—Christopher M. Kalivoda
(74) Attorney, Agent, or Firm—Marshall, Gerstein & Borun LLP

(57) ABSTRACT

Methods and apparatuses for shaping an illumination pattern for off-axis lithography are disclosed. A disclosed apparatus includes a first and second reflecting objective. The first reflecting objective includes a first reflective surface that reflects input light having an on-axis illumination pattern through a first focal point. The second reflecting objective includes a second reflective surface that receives the reflected light through the first focal point and through a second focal point aligned with the first focal point, and reflects the reflected light through an output end as output light having an off-axis illumination pattern. A disclosed method includes receiving collimated light with a conventional illumination pattern centered on an optical axis, symmetrically reflecting the collimated light in multiple directions away from the optical axis and reflecting the reflected light to create output light having an off-axis illumination pattern symmetrical about the optical axis.

30 Claims, 11 Drawing Sheets

FIG. 7
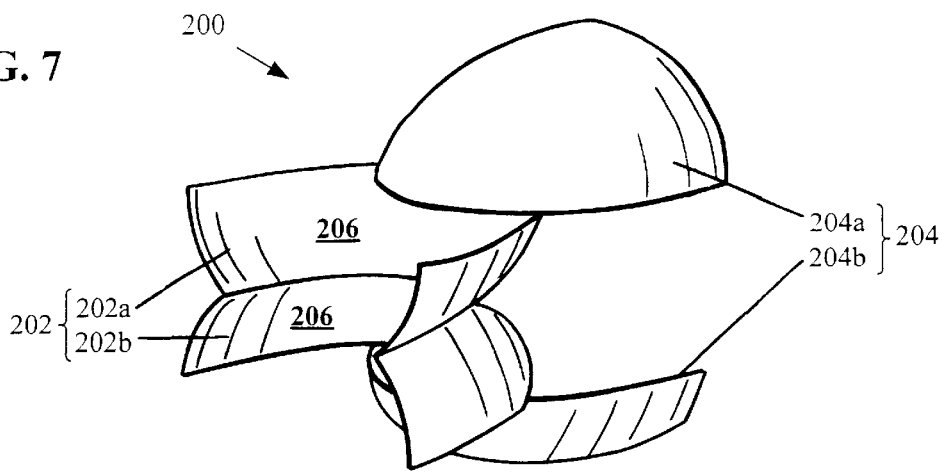
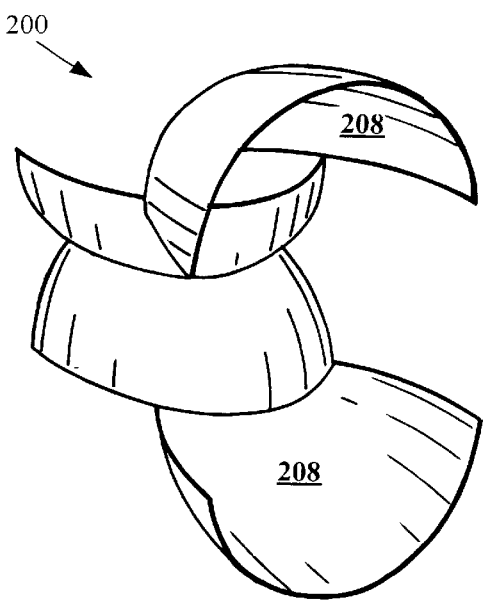
FIG. 8
FIG. 9
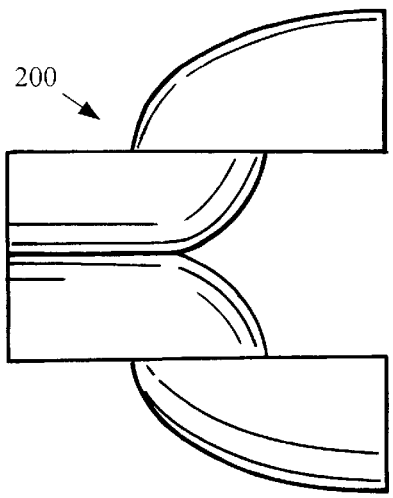

METHODS AND APPARATUS FOR OFF-AXIS LITHOGRAPHIC ILLUMINATION

FIELD OF THE TECHNOLOGY

The invention relates generally to lithography, and, more particularly, to deep ultraviolet and extreme ultraviolet lithographic exposure systems.

DESCRIPTION OF THE PRIOR ART

In microchip manufacturing, microlithography has been at the forefront of manufacturing techniques. Lithography is also generally the main factor that drives microchip technology and speed. As microchips require finer pattern structures in order to increase speed, the resolution of lithographic manufacturing techniques must keep pace. Many improvements in the lithographic process have involved utilizing illumination sources having shorter wavelengths to pattern the circuitry onto a substrate wafer. The shorter the wavelength of the illumination source, typically the better the resolution and quality of the circuit lines patterned onto the substrate wafer.

One such lithographic process is deep ultraviolet lithography which is currently used for most microchip manufacture. Depending of the specific lithography process used, the deep ultraviolet lithography process typically operates at a wavelength of 248 nanometers and utilizes lenses to illuminate a design pattern (e.g., a mask or reticle) allowing throughput light to form images on the substrate wafer. Other deep ultraviolet lithographic techniques are being developed with shorter wavelengths of 193 and 157 nanometers.

Generally, the deep ultraviolet lithography process is currently limited to forming circuits with geometries (also known as lines) of ~100 nanometers. Future generations of deep ultraviolet lithography are expected to be limited to forming circuits with some geometries of 50 nanometers. In order to improve upon this, another lithographic process currently being developed is extreme ultraviolet lithography (EUVL). The EULV process utilizes an illumination wavelength approaching that of x-rays, also termed "soft x-rays", generally in the range of 8–13 nanometers, and more particularly at 13 nanometers. EULV is capable of creating circuits having a 30 nanometer resolution.

Resolution enhancement techniques (RET) have also been utilized to increase the resolution, depth of focus, contrast and quality of the circuitry lines. One such technique involves off-axis illumination of the illumination source onto the design plate. As the size of features on the design plates approach or drop below the wavelength of the exposure illumination, diffraction effects become more pronounced. This can cause the first order of the diffracted image to fall outside the projection lens, thereby causing imaging problems because both the zero and first diffraction orders must fall on the projection lens in order to properly resolve the image from the design plate. Off-axis illumination involves symmetrically illuminating the design plate from more than one direction off the optical axis of the lithography system. The zero and a first diffraction orders from each illumination point reach the lens with the symmetrical arrangement compensating for any shift in the image. Alternatively, imaging errors in the horizontal-to-vertical line performance or aberrations in the projection lens may require asymmetrical illumination in order to compensate for the error, including adjusting the illumination balance throughout the illumination pattern (e.g., causing one pole to be of higher intensity than another) and/or adjusting the shape of the illumination pattern (e.g., the horizontal of the of the illumination pattern is elongated to be larger than the vertical of the illumination pattern).

Various illumination modes may be utilized, including annular illumination or multipole illumination. Annular illumination may include a single ring, concentric rings, etc. While dipole and quadrapole illumination modes are commonly used, multipole illumination modes may include illumination patterns having any number of poles, including octapole configurations.

Many proposals for creating these illumination modes have included using multiple illumination sources, refraction, microlens arrays, spatial filters, illumination blockers, etc. Multiple illumination sources increases the size, cost and complexity of the lithography system. Refraction becomes impractical as the wavelength becomes smaller, given the transmission properties of optical lenses degrade, and in fact absorb much of the light. For example, at 157 nanometers, most materials are opaque to the illumination and at EUVL wavelengths the illumination is almost totally absorbed by refractive optics. Microlens arrays also tend to degrade at many of the shorter wavelengths described above. Even in deep ultraviolet wavelengths, these effects can occur along with thermally induced distortions, chromatic aberrations, birefringence, etc. These effects are even more pronounced at EUVL wavelengths. Blocking designs have been found to be inefficient. Reflective optics, on the other hand, work well with deep ultraviolet lithography illumination and EUVL.

BRIEF DESCRIPTION OF THE DRAWINGS

FIG. 7 is a perspective diagram illustrating an example of a dipole illumination shaping device;

FIG. 8 is a perspective diagram illustrating the illumination shaping device of FIG. 7.

FIG. 9 is a diagram illustrating a side view of the illumination shaping device of FIGS. 7–8.

DETAILED DESCRIPTION OF THE EXAMPLES

Figure 1:
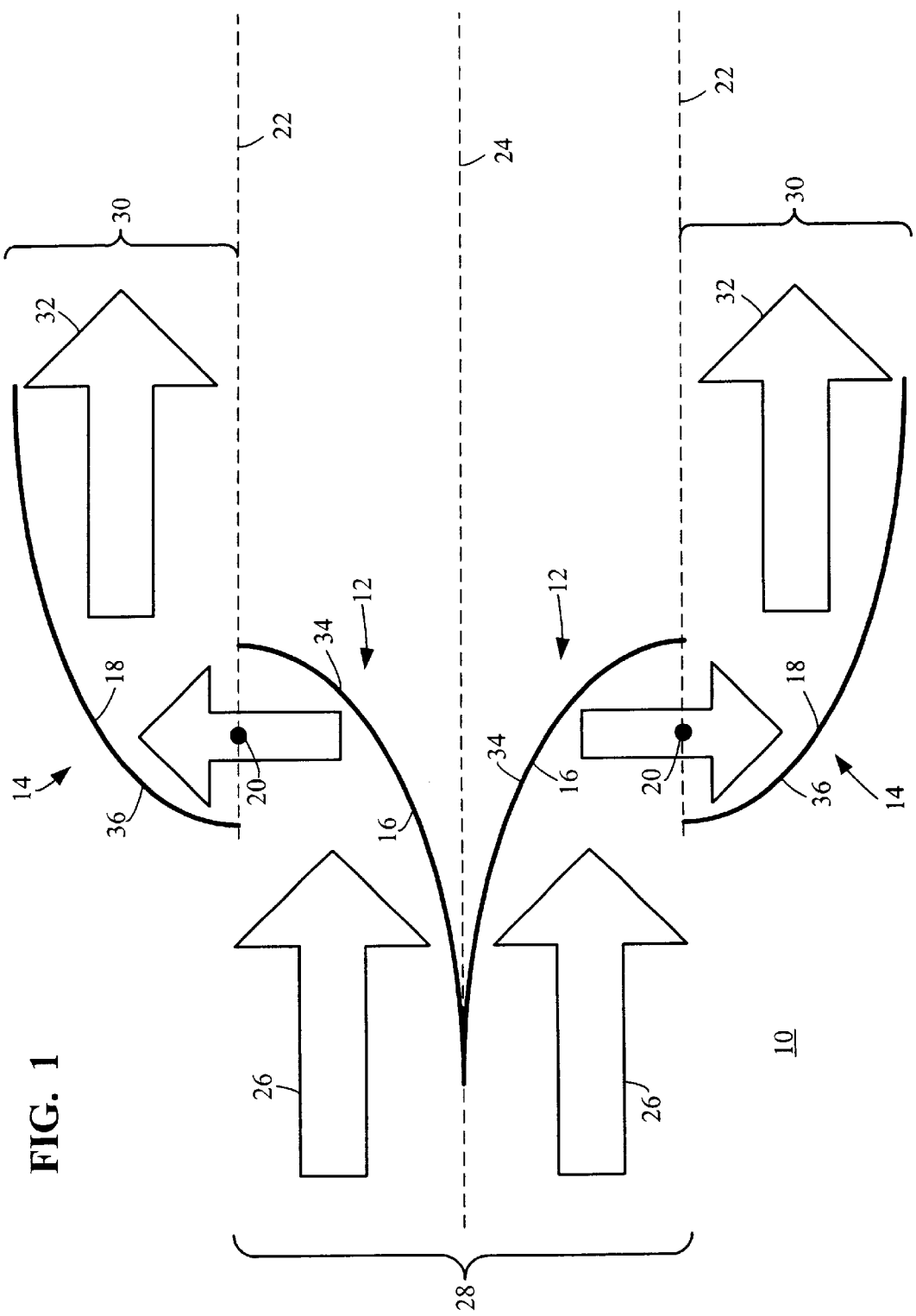
FIG. 1 is a cross-sectional diagram illustrating an example of a reflective lithographic illumination shaping device.

An example of a reflective illumination shaping device 10 is shown generally in FIG. 1. Although the illumination shaping device 10 is particularly well suited for off-axis step-and-scan microlithography, or the like, persons of ordinary skill in the art will readily appreciate that the teachings of the instant invention are not limited to any particular type of microlithography or microchip manufacturing illumination exposure process. On the contrary, the teachings of the invention can be employed with virtually any optical system where shaping the illumination pattern is desired. Thus, although the illumination shaping device 10 will be described below primarily in relation to off-axis lithographic microchip manufacturing using EUVL or deep ultraviolet lithography, persons of ordinary skill in the art will readily appreciate that the apparatus and method could likewise be used with any type of lithography methods, illumination system, exposure system, etc.

Generally, the illumination shaping device 10 includes reflecting objectives 12, 14. In the illustrated example, the reflecting objectives 12, 14 are paraboloid sections depicted in FIG. 1 as finite half-parabola cross-sections having similar or identical curvatures. That is, the paraboloid sections of the reflecting objectives 12, 14 are the same, though, as discussed further below, the paraboloid sections of the reflecting objectives 12, 14 may differ depending on the desired illumination pattern. For the sake of clarity in explanation, the input reflecting objective 12 will be referred to herein as an input reflecting objective 12, and the output reflecting objective 14 will be referred to herein as an output reflecting objective 14. However, this terminology is merely for the sake of distinguishing each reflecting objective 12, 14, and is not intended to necessarily be descriptive of these reflecting objectives 12, 14 and should not be construed as a limitation on the scope of the claims. Furthermore, the depiction of the reflecting objectives 12, 14 as having a half-parabola cross-section is not necessarily reflective of all examples of the illumination shaping device 10, as will be seen further below, but nevertheless is helpful to illustrative of how the illumination shaping device 10 alters the illumination pattern of light, the principles of which hold true for all examples of the illumination shaping device 10.

Each reflecting objective 12, 14 further includes a reflective surface 16, 18 respectively. The reflective surfaces 16, 18 are generally coated to optimally reflect illumination used with deep ultraviolet lithography or EUVL. In particular, the reflective surfaces 16, 18 are manufactured or coated so as to reflect wavelengths below 248 nanometers, and more particularly the reflective surfaces 16, 18 reflect wavelengths in the range of 8–248 nanometers, and even more particularly the reflective surfaces 16, 18 reflect wavelengths at 248 nanometers, 193 nanometers, 157 nanometers and/or 13 nanometers. While those of ordinary skill in the art will readily understand that the materials used to manufacture or coat the reflective surfaces 16, 18 may vary depending on the wavelength being utilized, examples of some coatings include fused silicon impregnated with fluorine, calcium fluoride and molybdenum. Further, those of ordinary skill in the art will appreciate that the coating of any reflective surfaces used in lithography, especially deep ultraviolet lithography and EUVL, may require several coatings and should be nearly perfect in order to achieve a proper image on the substrate wafer. The specific methods of manufacture for coating reflective surfaces 16, 18 used with deep ultraviolet lithography and EUVL are also well known to those of ordinary skill in the art and, thus, will not be described further herein. As with the reflecting objectives 12, 14, the reflective surface 16 will be referred to herein as the input reflective surface 16, and the reflective surface 18 will be referred to herein as the output reflective surface 18, though, as above, this is merely for the sake of clarity of explanation and should not be construed as a limitation.

Each reflecting objective 12, 14 further includes a focal point 20 for each paraboloid section. While each reflecting objective 12, 14 has independent focal points, the focal points 20 are coaligned so as to occupy the same point in space. In other words, the corresponding paraboloid sections of the reflecting objectives 12, 14 can be considered to share the same focal point 20. The reflecting objectives 12, 14 also each have principal axes 22 passing through the focal points 20 that may run parallel to, though off the axis of, the optical axis 24 of the lithography system. In the example of FIG. 1, the principal axes 22 of both the reflecting objectives 12, 14 are coaxial, though this may not always be the case depending on the desired illumination pattern, as described further below.

In operation, input light 26 is incident upon an input end 28 of the output reflecting objective 14. Generally, input light 26 for lithography will be collimated and on-axis with the optical axis 24. Further, the input light 26 generally has a conventional illumination mode centered on the optical axis 24. That is, the input illumination pattern is generally monopole in a circular or elliptical pattern. The input reflecting objective 12 is centered on the optical axis 24 so as to uniformly, evenly and symmetrically receive the input light 26 on the input reflective surface 16. Those of ordinary skill in the art will readily understand that the illumination pattern of the input light 26 may not be perfectly circular or elliptical considering optical alignment is one of degree and approximation.

The input reflective surface 16 reflects the input light 26 to the output reflective surface 18 of the output reflecting objective 14. The output reflective surface 18, in turn, reflects the input light 26 through an output end 30 of the output reflecting objective 14 as output light 32. The output light 32 has an illumination pattern off the optical axis (i.e., off-axis) in an annular or multipole pattern depending on the configuration of the reflecting objectives 12, 14. The output reflecting objective 14 is also centered about the optical axis 24 thereby causing the illumination pattern of the output light 32 to be symmetrical about the optical axis In order to avoid stray reflections and maintain the cohesion of the illumination pattern of the output light 32 as it is incident on the design pattern, surfaces 34, 36 opposite the reflective surfaces 16, 18 may be non-reflective surfaces designed to absorb the illumination wavelength so as to avoid unintended scattering of the input light 26 and the output light 32. Coatings and techniques for absorbing light are well known to those of ordinary skill in the art, the choice of which may depend on the illumination wavelength.

Figure 2:
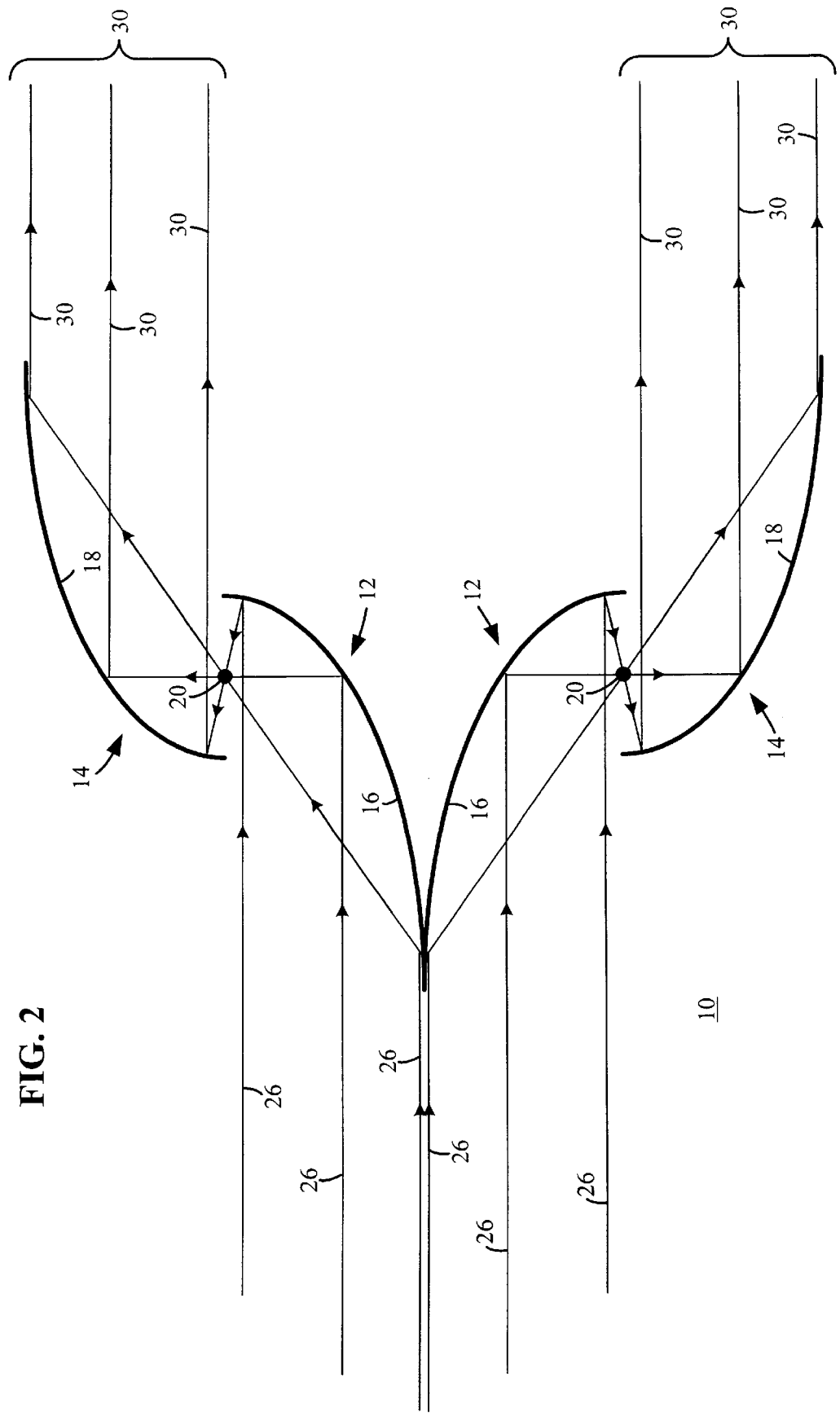
FIG. 2 is a cross-sectional diagram illustrating the light path through the illumination shaping device of FIG. 1.

The formation of an off-axis, annular or multipole illumination pattern from an on-axis, monopole illumination pattern using the illumination shaping device 10 may be better understood via the ray diagram of FIG. 2. As shown in FIG. 2, the input light 26 from an illumination source (not shown) is reflected from the input reflective surface 16 of the input reflecting objective 12 onto the output reflective surface 18 of the output reflecting objective 14. The input light 26 reflects off the output reflective surface 18 of the output reflecting objective 14 and through the output end 30. It is a principle of geometric optics that incident light which is collimated and co-propagates parallel to the principal axis of a paraboloidal mirror will always pass through the focal point of the paraboloidal mirror. Therefore, all rays of the input light 26 incident on the reflecting surface 16 of a paraboloid section will pass through the focal point 20.

It is also a principal of geometric optics that all incident light passing through the focal point of a paraboloidal mirror, regardless of direction, will be reflected as collimated light. Therefore, all rays of the input light 26 which are reflected off the input reflective surface 16, are further reflected off the output reflective surface 18 as collimated output light 32, because the focal points 20 are shared by both reflective surfaces 16, 18. This allows the output light 32 to have an illumination pattern that is off the axis of the optical axis 24. Assuming the input light 26 is centered on the optical axis 24, the illumination pattern of the output light 32 should have uniform intensity and radial symmetry about the optical axis 24. However, the intensity may be varied across the illumination pattern by variations in the coatings of the reflective surfaces 16, 18. For example, with a multipole illumination pattern, it may be desirable to increase or decrease the intensity in one of the poles in order to correct for any lens aberrations. Therefore, those portions of the reflective surfaces 16, 18 that reflect the light that will form the pole or section having a different intensity may be coated differently than other portions of the reflective surfaces 16, 18. Varying the coating and other methods of adjusting the intensity of light, including input light 26 having non-uniform intensity, are known to those of ordinary skill in the art.

As seen in FIGS. 1 and 2, the reflecting objectives 12, 14 are symmetrical about the optical axis 24. However, this is only a cross-sectional view of the illumination shaping device 10. The degree of symmetry about the optical axis 24 is dependent on the desired illumination pattern of the output light 32. For example, it may be desirable to provide an illumination pattern that has a vertical axis larger than the horizontal axis. Therefore, those portions of the reflecting objectives that form the image of the vertical axis may be elongated according to the desired illumination pattern.

Figure 3:
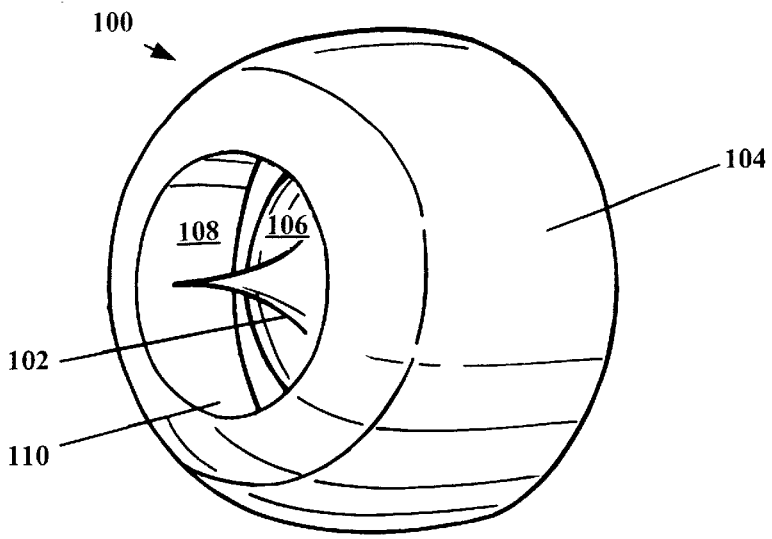
FIG. 3 is a perspective diagram illustrating an example of an annular illumination shaping device.
Figure 4:
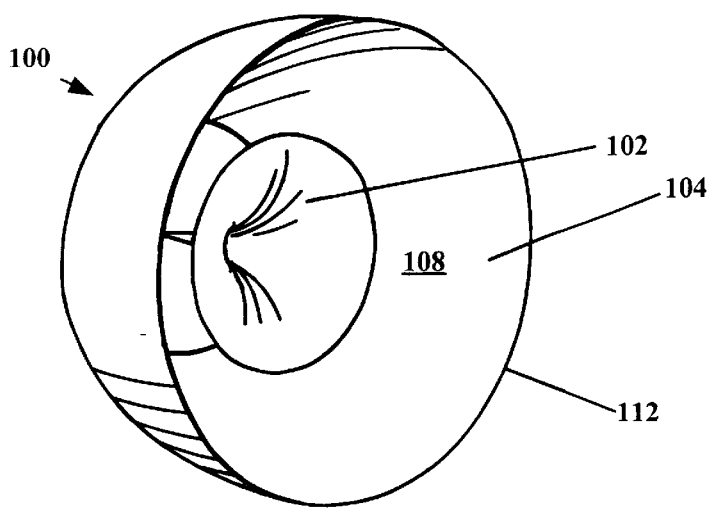
FIG. 4 is a perspective diagram illustrating the illumination shaping device of FIG. 3.
Figure 5:
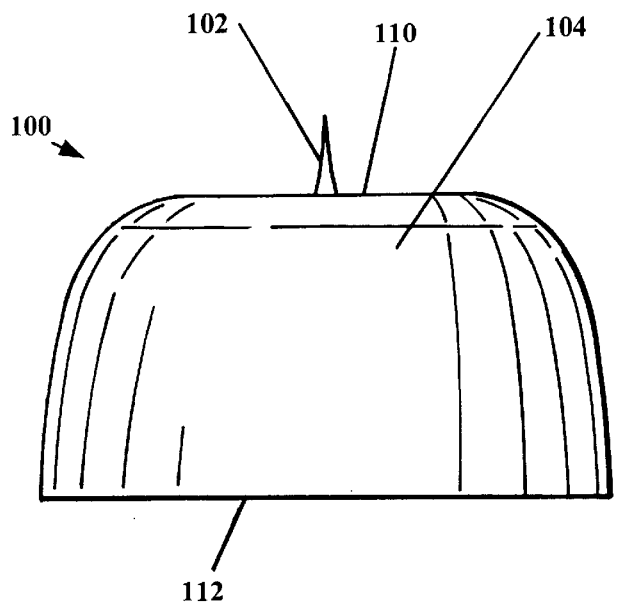
FIG. 5 is a diagram illustrating a side view of the illumination shaping device of FIGS. 3–4.
Figure 6:
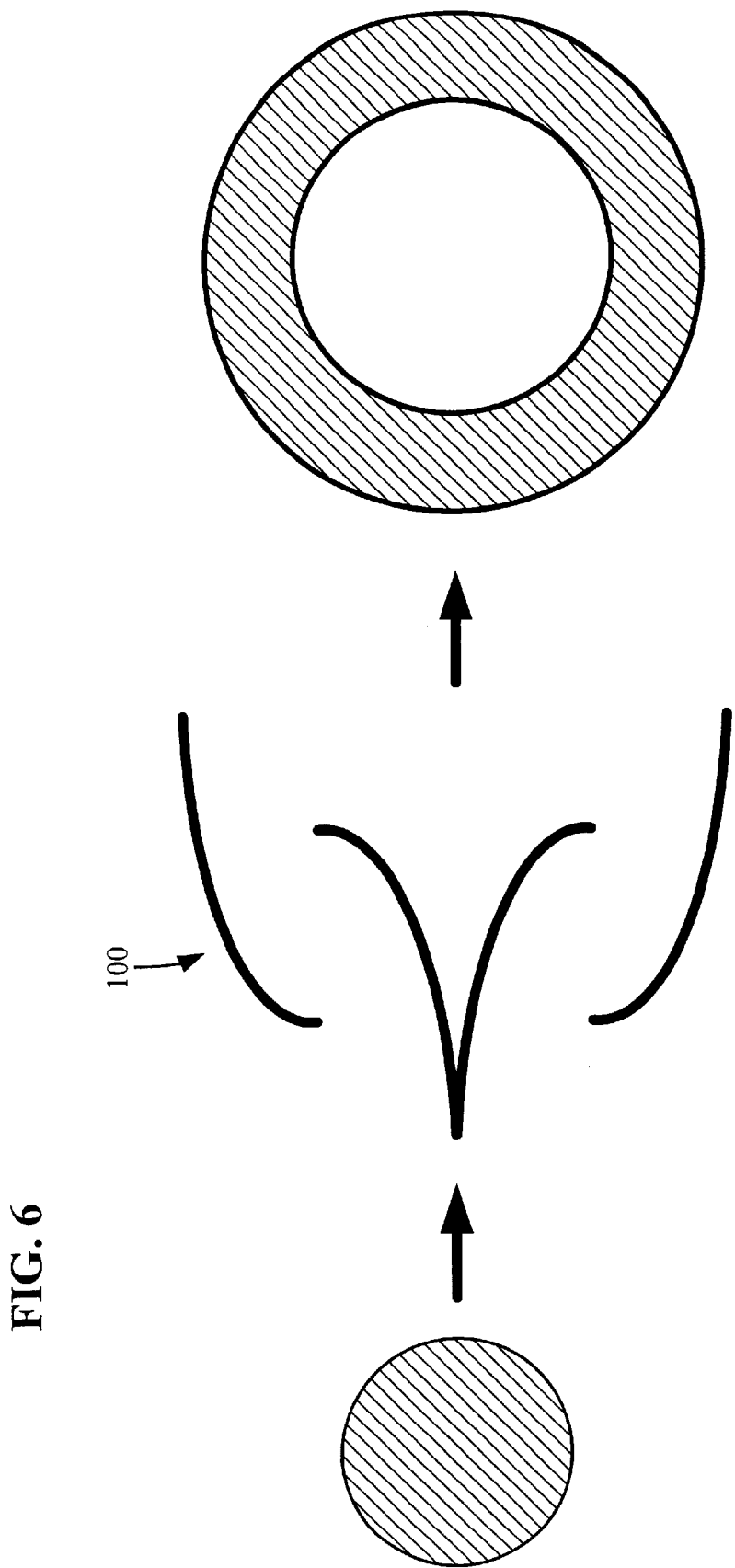
FIG. 6 is a diagram illustrating a representative example of the effect of the illumination shaping device of FIGS. 3–5 on an input illumination pattern.

Referring to FIGS. 3–5, an example of an illumination shaping device 100 for providing output light 32 having an annular illumination pattern is provided. A demonstrative drawing of how the illumination shaping device 100 changes a monopole, on-axis illumination pattern to an annular pattern is shown in FIG. 6. As seen best in FIGS. 3 and 4, the reflecting objectives 102, 104 correspond to the reflecting objectives 12, 14 of FIGS. 1 and 2. The reflecting objectives 102, 104 are radially and uniformly symmetrical about an axis, which would generally be the optical axis 24 or the axis of propagation for the input light 26. The input reflecting objective 102 may further be thought of as a finite half-parabola rotated about its asymptote. Likewise, the output reflecting objective 104 may be thought of as a finite half-parabola rotated about an axis positioned parallel to, but away from its asymptote at a distance of twice the half-parabola's width from the asymptote. In either case, the reflecting objectives 102, 104 are essentially rotated about an axis that will be the optical axis 24. In this particular example, the starting half-parabola (i.e., the cross-section) of the reflecting objectives 102, 104 are identical, though inverted to one another.

However, as mentioned above, it may be desirable to create an illumination pattern that is elongated along one axis. For example, rather than a perfectly annular illumination pattern, an oval illumination pattern may be desired. Therefore, rather than having the reflecting objectives 102, 104 being perfectly symmetrical about the optical axis 24, the reflecting objectives 102, 104 may be elongated in a direction perpendicular to the optical axis 24 so as to have an oval shape when viewed along the optical axis 24. The input light 26 would then be reflected to follow the shape of the reflecting objectives 102, 104 using the same principles described above to form an oval illumination pattern about the optical axis 24. The elongation of the reflecting objectives 102, 104 may cause variations in the intensity of the illumination pattern (e.g., greater intensity along the un-elongated portions and less intensity along the elongated portions) given the same amount of input light 26 is being spread over a larger reflective surface in some areas. One method of correcting for this is to vary the reflective coatings on the reflective surfaces to reflect more or less light as needed. Therefore, by varying the shape of the reflecting objectives 102, 104, the illumination pattern of the output light 32 may be manipulated to any desired illumination pattern.

In the example of FIGS. 3–5, given the radial symmetry of the reflecting objectives 102, 104, the reflecting objectives 102, 104 may be thought of as being composed of an infinite number of paraboloid sections having reflective surfaces 106, 108, each paraboloid section having a focal point 20. This would mean that the reflecting objectives 102, 104 have a focal ring composed of each focal point 20 of the infinite number of paraboloid sections having reflective surfaces 106, 108. Therefore, the focal rings of reflecting objectives 102, 104 are coaligned and occupy the same space, similar to how the focal points 20 are aligned in FIGS. 1 and 2. Reflective surfaces 106, 108 correspond to reflective surfaces 16, 18, respectively.

Referring to FIG. 3, an opening defined by an edge 110 in the rearward end of the output reflecting objective 104 exposes the input end 28. Input light 26 is permitted to enter through the opening 110 and reflect off of the input reflective surface 106 of the input reflecting objective 102. The reflected input light 26 is reflected through the focal rings of reflecting objectives 102, 104 and onto the output reflective surface 108 of the output reflecting objective 104. The output reflecting objective 104 then reflects the light as output light 32 through a second opening defined by an edge 112 in the forward-facing end of the output reflecting objective 104, corresponding to the output end 30, seen best in FIG. 4. Terminology regarding the orientation of the disclosed examples of an illumination shaping device, such as "upper", "lower", "rearward-facing", "forward-facing", etc., are used herein for ease of explanation only and are not intended to limit the illumination shaping device to any particular orientation.

Given the shape of the reflecting objectives 102, 104 any collimated input light 26 having a monopole, on-axis illumination pattern would be incident on the input reflective surface 106 and redirected out of the illumination shaping device 100 so as to have an off-axis, annular illumination pattern, as indicated in FIG. 6, based on the geometric principles outlined above. Even though the reflecting objectives 102, 104 may not seem to resemble the average paraboloidal mirror, the same geometrical optical principles apply. In other words, all collimated input light 26 is uniformly reflected by the input reflective surface 106 away from the optical axis 24 and through the focal ring. Because the focal ring of the input reflective surface 106 is shared with the focal ring of the output reflective surface 108, the reflected input light 26 is incident on the output reflective surface 108 through the focal ring, causing the output light 32 to be re-collimated, given the reflective surface 108 is theoretically composed of an infinite number of paraboloid-section reflective surfaces. Furthermore, because the input light 26 is uniformly and radially directed away from the optical axis 24 via the input reflective surface 106, the illumination pattern of the output light 32 is annular and symmetrical about the optical axis 24. It is noted that, as shown in FIG. 2, the input light 26 reflects off the input reflective surface 16 at several different angles, not all of which are perpendicular to the optical axis 24 or radial from a common point. However, for the purposes of explaining the reflection of the input light 26, the terms "radial" and "radially" are used to reference the fact that all rays of the input light 26 reflect away from the optical axis 24. A view along the optical axis 24 would appear to be radial and symmetrical about the optical axis 24.

Referring to FIGS. 7–9, an example of a multipole illumination shaping device 200 for shaping output light 32 having a dipole illumination pattern is provided. The illumination shaping device 200 includes reflecting objectives 202, 204, which correspond to the reflecting objectives 12, 14 of FIGS. 1 and 2, respectively. Though the dipole illumination shaping device 200 is described as corresponding to the illumination shaping device 10 of FIGS. 1 and 2, it can be seen in FIG. 9, and further in the representation of the dipole illumination shaping device 200 in FIG. 10, that the cross-section of the dipole illumination shaping device 200 is not identical to that of FIGS. 1 and 2. Rather, the upper and lower portions of the input reflecting objective 202 are depicted as two half-paraboloid sections, similar to the upper and lower portions of the output reflecting objective 204, that have been intersected, with the intersecting portions "cut away". The paraboloid sections are intersected to capture the majority of the input light 26. Otherwise, an input reflecting objective 202 having a cross-section identical to that for the illumination shaping device of FIGS. 1 and 2 would require two half-paraboloids joined only at a single point at the input end of the illumination shaping device 200. This would cause a significant portion of the input light 26 to miss the input reflecting objective 202 by passing between the half-paraboloids. By essentially having two half-paraboloids intersecting, preferably by equal amounts, with the intersecting portions removed, the input reflecting objective 202 accepts most or all of the input light 26.

The reflecting objectives of multipole illumination shaping devices includes paraboloid sections, the inner surfaces of which are the reflective surfaces. The number of paraboloid sections for each reflecting objective is proportional to the number of desired poles. An output reflecting objective would generally include a paraboloid section to correspond with each paraboloid section for the input reflecting objective. In the case of the annular pattern, it can be assumed that an annular pattern is really an infinite number of poles, in which case the number of paraboloid sections is infinite. In the present example, the number of paraboloid sections for a dipole illumination shaping device is two. For example, input reflecting objective 202 has an upper paraboloid section 202a and a lower paraboloid section 202b. The inner surfaces of the paraboloid sections 202a, 202b correspond to an input reflective surface 206. The output reflecting objective 204 has an upper paraboloid section 204a and a lower paraboloid section 204b. The inner surfaces of paraboloid sections 204a, 204b correspond to an output reflective surface 208.

Figure 10:
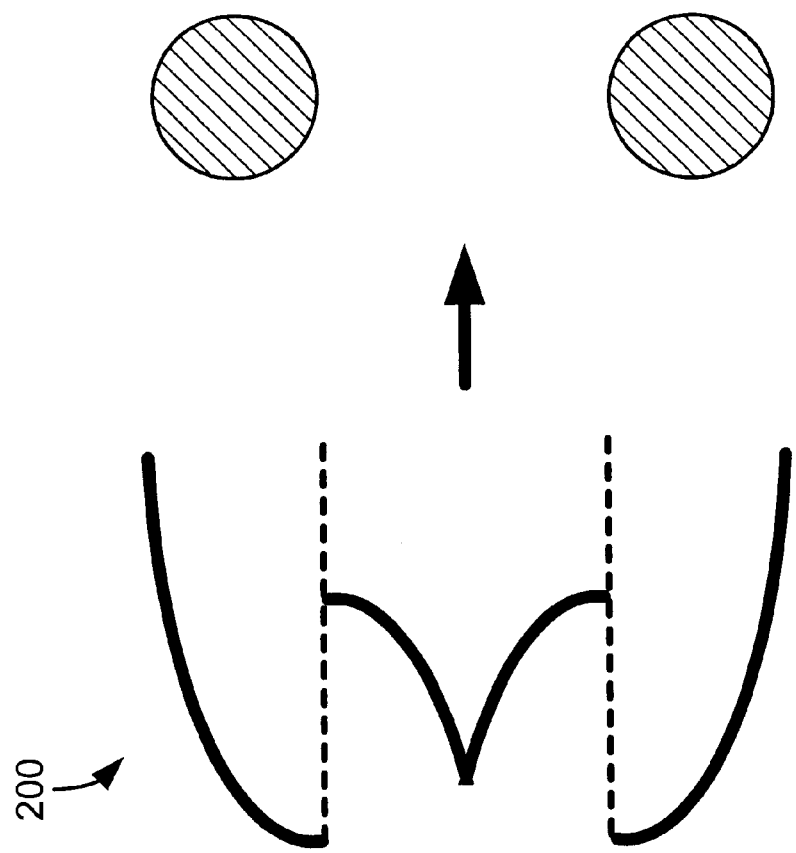
FIG. 10 is a diagram illustrating a representative example of the effect of the illumination shaping device of FIGS. 7–9 on an input illumination pattern.

As with the annular illumination shaping device 100, the principles regarding the operation of the dipole illumination shaping device 200 are similar to those described above. Input light 26 is incident upon the input reflective surface 206, preferably with equal distribution of the input light 26 on the upper paraboloid section 202a and the lower paraboloid section 202b. The paraboloidal shape of the input reflective surface 206 reflects all collimated light through a focal point. Because the input reflecting objective 202 is composed of two, preferably equal, paraboloid sections 202a, 202b, the input light 26 is redirected in two opposite directions away from the optical axis 24, one through the focal point of the upper paraboloid section 202a and the other through the focal point of the lower paraboloid section 202b. The reflected input light 26 is also through the focal point of the upper and lower paraboloid sections 204a, 204b of the output reflecting objective 204, thereby redirecting the light into two collimated beams of output light 32 having a dipole illumination pattern, as represented by FIG. 10.

As with the annular illumination shaping device 100 above, the reflecting objectives 202, 204 may be modified to manipulate the illumination pattern. For example, if it is desired to have one of the poles larger than the other, upper paraboloid sections 202a, 204a may be made to have a larger curvature than the lower paraboloid sections 202b, 204b (e.g., viewing the illumination shaping device along the optical axis 24 would reveal the curvature of the upper paraboloid sections 202a, 204a as having greater radii perpendicular to the optical axis 24 than that of the lower paraboloid sections 202b, 204b). The intensity may be varied as necessary using techniques similar to those described above.

Figure 11:
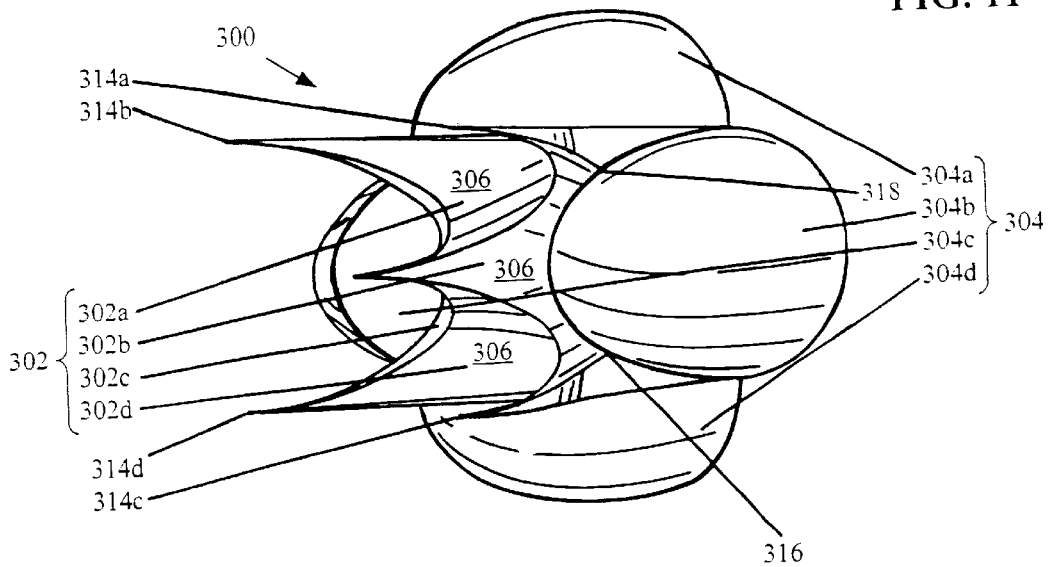
FIG. 11 is a perspective diagram illustrating an example of a quadrapole illumination shaping device.
Figure 12:
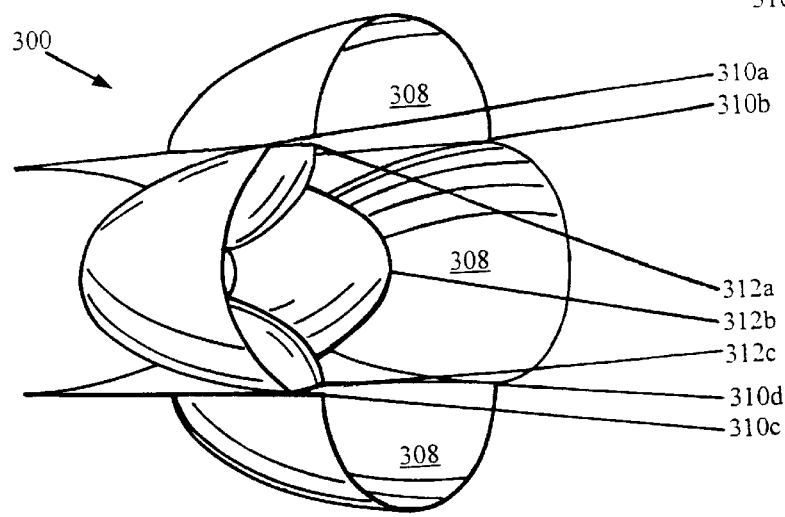
FIG. 12 is a perspective diagram illustrating the illumination shaping device of FIG. 11.
Figure 13:
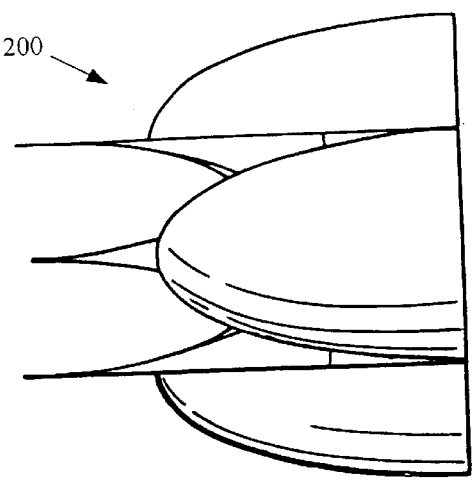
FIG. 13 is a diagram illustrating a side view of the illumination shaping device of FIGS. 11–12.

Referring to FIGS. 11–13, a second example of a multipole illumination shaping device is shown. In particular, this is an example of a quadrapole illumination shaping device 300. Similar to the dipole illumination shaping device 200, the quadrapole illumination shaping device 300 includes an input reflecting objective 302 and an output reflecting objective 304. The input reflecting objective 302 is composed of four paraboloid sections 302a, 302b, 302c, 302d. The inner surfaces of the paraboloid sections 302a, 302b, 302c, 302d correspond to an input reflective surface 306. The output reflecting objective 304 is composed of four paraboloid sections 304a, 304b, 304c, 304d, the inner surfaces of which correspond to an output reflective surface 308. Each paraboloid section 302a, 302b, 302c, 302d of the input reflecting objective 302 has a focal point 20 that is shared with a focal point 20 of the paraboloid sections 304a, 304b, 304c, 304d of the output reflecting objective 304.

Further, similar to the dipole illumination shaping device 200, the paraboloid sections 302a, 302b, 302c, 302d can be thought of as four intersecting half-paraboloids without the intersecting portions. Again, it is preferable that each half-paraboloid is intersected by equal amounts to create approximately equal-sized paraboloid sections 302a, 302b, 302c, 302d. As can be derived from the above examples, the number of paraboloid sections is proportional to the desired illumination pattern. For example, a tripole illumination pattern would utilize an input reflecting objective having three intersecting half-paraboloids without the intersecting portions to create three paraboloid sections; an octapole illumination pattern would utilize an input reflecting objective having eight intersecting half-paraboloids to create eight paraboloid sections, etc. The output reflecting objective, in turn, includes a corresponding paraboloid section for each paraboloid section in the input reflecting objective. Though not shown in the above examples, in some cases the paraboloid sections for the output reflecting objective may also intersect, in which case the intersecting portions are not included.

Figure 14:
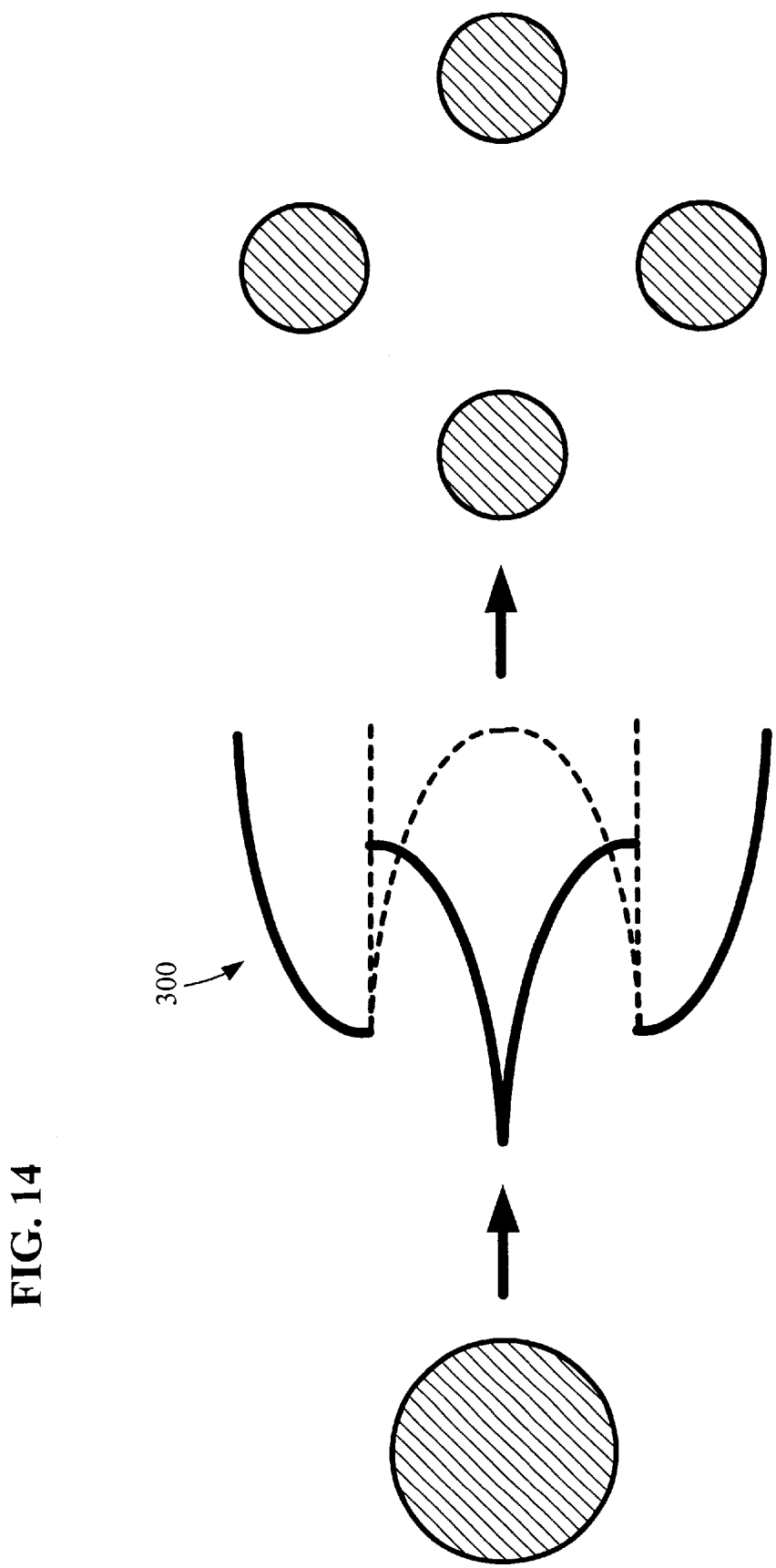
FIG. 14 is a diagram illustrating a representative example of the effect of the illumination shaping device of FIGS. 11–13 on an input illumination pattern.

Referring again to FIGS. 11–13, and further referring to FIG. 14, input light 26 is incident, preferably uniformly, upon each of the paraboloid sections 302a, 302b, 302c, 302d of the input reflecting objective 302. The input light 26 is reflected in four directions away from the optical axis 24 and through the focal point 20 of its corresponding paraboloid section 302a, 302b, 302c, 302d. Preferably each reflection direction is approximately orthogonal to the adjacent reflection direction. The reflected input light 26 is reflected again by each corresponding paraboloid section 304a, 304b, 304c, 304d of the output reflecting objective 304 as four beams of output light 32 having a quadrapole illumination pattern, as represented by FIG. 14. The beams of output light 32 are generally collimated given the reflected input light 26 passed through the focal point 20 of each paraboloid section 304a, 304b, 304c, 304d.

As can be seen from these examples, the redirection of the input light 26 having been reflected off an input reflecting objective is proportional to the number of desired poles and is preferably radially symmetrical about the optical axis 24 to provide a radially symmetrical illumination pattern. This means each of the paraboloid sections of a reflecting objective have the same shape, curvature, reflective properties, etc. However, this may be varied, either by varying reflective coatings or non-uniformly distributing the input light 26 on the input reflecting objective 102, 202, 302, so as to create the illumination patterns with varying degrees of intensity throughout the pattern. The curvatures of the paraboloid sections may also be varied to manipulate the illumination pattern.

In some of the above described examples, notably the annular illumination shaping device 100, the input reflecting objectives 12, 102 and the output reflecting objectives 14, 104 are shown as "floating" objects or otherwise completely detached from one another. However, many known techniques, which will not significantly degrade optical performance, are known by those of ordinary skill in the art and can be used to physically secure the "floating" reflecting objectives 12, 14, 102, 104 in their respective orientations. For example, structural supports may extend from an edge or surface of the input reflecting objective 12, 102 to an edge or surface of the output reflecting objective 14, 104. Such structural supports can be manufactured to a width and composed of materials that are unobtrusive to the illumination pattern and the illumination wavelength, as understood by those of ordinary skill in the art.

Additionally, the supports may be positioned to avoid the more intense portions of the illumination pattern for the output light 32. While this may be more difficult for an annular illumination shaping device 100 as depicted in FIGS. 3–5, a quadrapole illumination shaping device 300 as depicted in FIGS. 11–13 may have supports extending from a forward-facing corner 310a, 310b, 310c, 310d of the output reflecting objective 304 to a forward-facing edge 312a, 312b, 312c, (312d not shown) of a paraboloid section 302a, 302b, 302c, 302d of the input reflecting objective 302 and/or an adjacent forward-facing corner 310a, 310b, 310c, 310d of the output reflecting objective 304. Alternatively, or in addition, the supports may extend from one or more forward-facing corners 310a, 310b, 310c, 310d of the output reflecting objective 304 to a corresponding rearward-facing corner 314a, 314b, 314c, 314d of the input reflecting objective 302. Similar support structures may be utilized with other multipole illumination shaping devices, such as the dipole illumination shaping device.

While structural supports such as those described above may be beneficial to adding structural integrity to a multipole illumination shaping device 200, 300, other methods of securing the reflecting objectives 202, 204, 302, 304 may also be utilized in conjunction with or as an alternative to the structural supports. Adhesive may be introduced at the junctions where the input reflecting objective 202, 302 meets the output reflecting objective 204, 304 respectively. For example, referring to FIG. 11, the inside-facing edge of paraboloid section 304b meets the outside-facing edge of the paraboloid section 302b at two junctions 316, 318. A small amount of adhesive, the choice of which is within the knowledge of those of ordinary skill in the art, may be introduced at these junctions, either between the edges or alongside the edges. The location, type and amount of adhesive should not significantly interference with the optical properties of the illumination shaping device. Providing the adhesive alongside the edge may tend to avoid introducing a gap between the corresponding paraboloid sections 302b, 304b, whereby a gap may cause misalignment of the focal points 20. Alternatively, the edges of one or more of the paraboloid sections 302b, 304b may be cut down just enough to permit the introduction of some adhesive between the edges. Other methods, such as a structural member having adhesive on opposite sides may be introduced between the edges. Adhesives may further be introduced at the corners 310a, 310b, 310c, 310d of adjacent paraboloid sections 304a, 304b, 304c, 304d.

Figure 15:
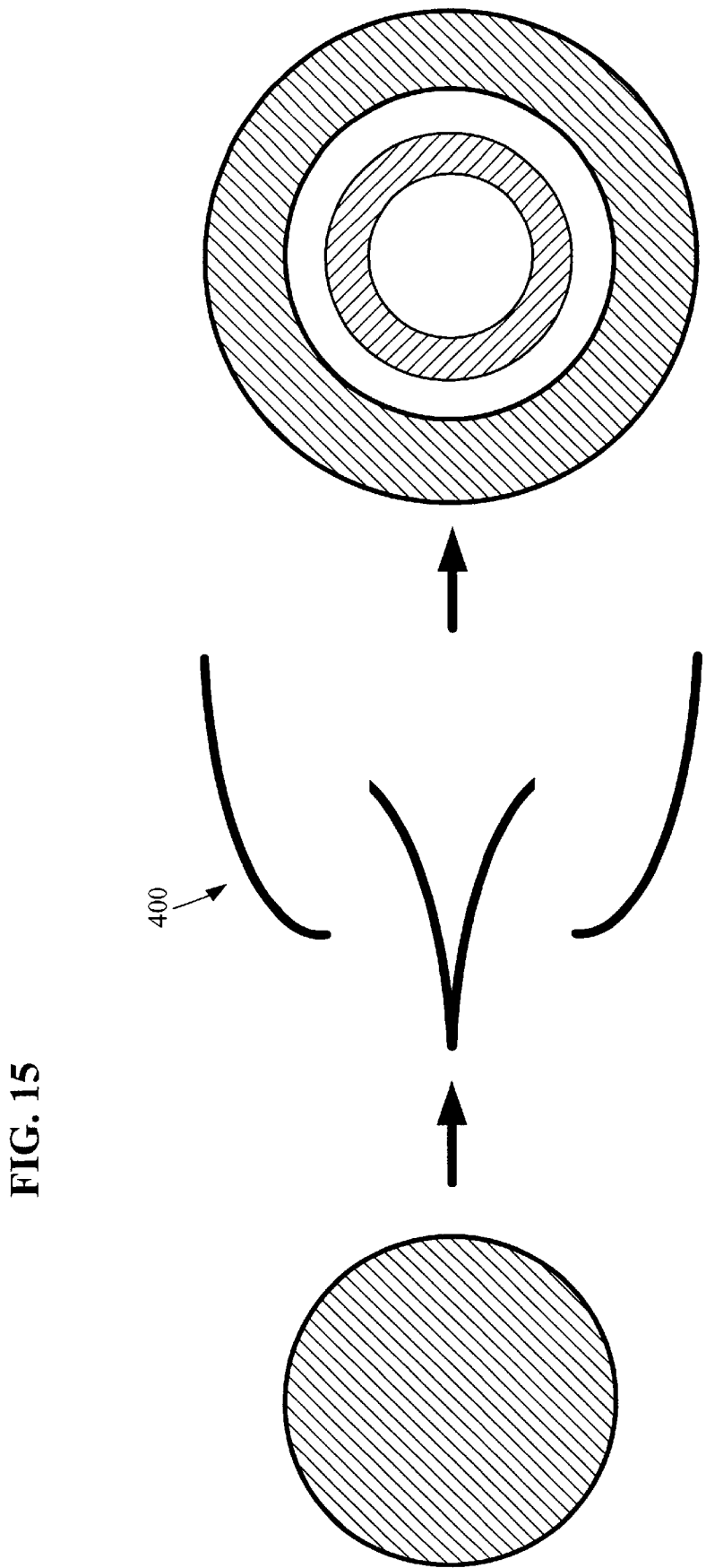
FIG. 15 is a diagram illustrating a representative example of the effect of an illumination shaping device on an input illumination pattern to create an annular illumination pattern with concentric rings.

As discussed above, the desired shape of the illumination pattern of the output light 32 may be varied by the number of paraboloid sections being used. However, other variations to the illumination pattern may be accomplished by varying the paraboloid sections themselves. For example, referring to FIG. 15, a cross-section of an annular illumination shaping device 400 is shown with a representation of the change in illumination pattern. By trimming the edge of the input reflecting objective, a portion of the input light 26 is allowed to pass through unimpeded. The remaining input light 26 is reflected as described above. The resulting illumination pattern of the output light 32 is an annular pattern having concentric rings. The desired width of the rings can be varied with the degree to which the edges are trimmed. The number of rings can further be varied by providing the appropriate openings in the reflecting objectives. Though delaying some of the input light 26 through reflection while allowing the remaining the input light 26 to pass through unimpeded causes the total output light 32 to be incoherent, this should not affect the use of the illumination device in lithography systems.

Other variations in the paraboloid sections may also be used to vary the illumination pattern. For example, the curvature of each paraboloid section, and hence the focal length, may be varied, provided the focal point of each paraboloid section of the input reflecting objective is aligned with the focal point of the corresponding paraboloid section of the output reflecting objective. This means the curvatures may resembles sections of a spheroid or ellipsoid, if desired, or the paraboloid sections of the input reflecting objective may have different curvatures than the paraboloid sections of the output reflecting objective.

Figure 16:
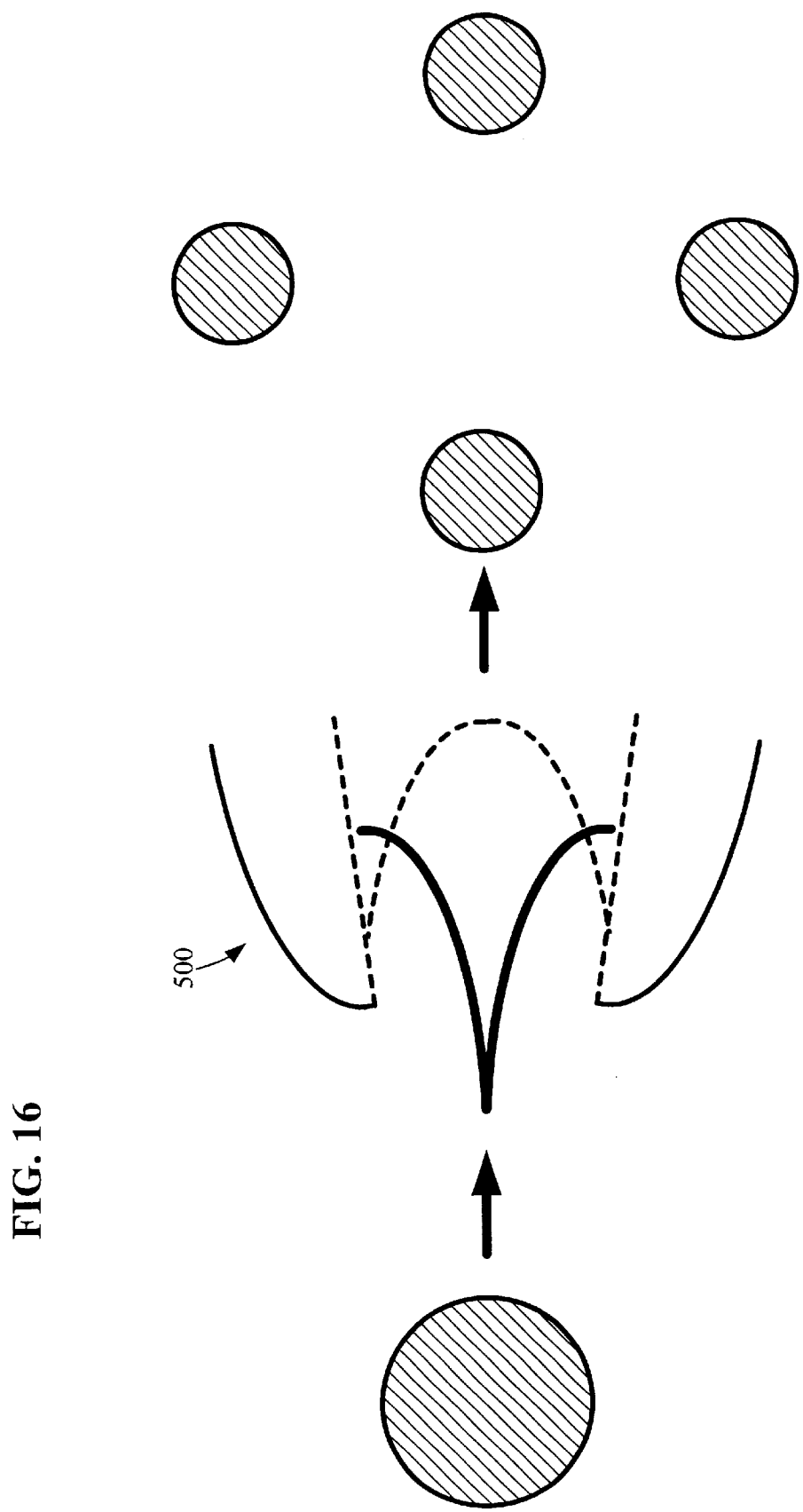
FIG. 16 is a diagram illustrating a representative example of the effect of an illumination shaping device on an input illumination pattern to create an illumination pattern diverging from the optical axis.

Paraboloid sections of the same reflecting objective may also be different from one another if an asymmetrical illumination pattern is desired. Examples of differing paraboloid sections to manipulate the illumination pattern have been described in greater detail above. The paraboloid sections described above have generally been described as having coaxial principal axes (e.g., the reflecting objectives 12, 14 share a common principal axis). However, the paraboloid sections may be pitched forward or backward to cause the principal axis of the paraboloid sections to be at an angle to the optical axis 24, as shown in FIG. 16. The focal point of each paraboloid section is still aligned with the focal point of each corresponding paraboloid section. The illumination shaping device 500 of FIG. 16 is shown to be similar to the illumination shaping device 300 as shown in FIG. 14, though varying the pitch of the paraboloid sections is applicable to all examples of an illumination shaping device. In the present example, the paraboloid sections of the output reflecting objective are pitched backward. This causes the output light to diverge away from the optical axis, thereby expanding the illumination pattern. By pitching the paraboloid sections forward, the illumination pattern would be contracted.

Figure 17:
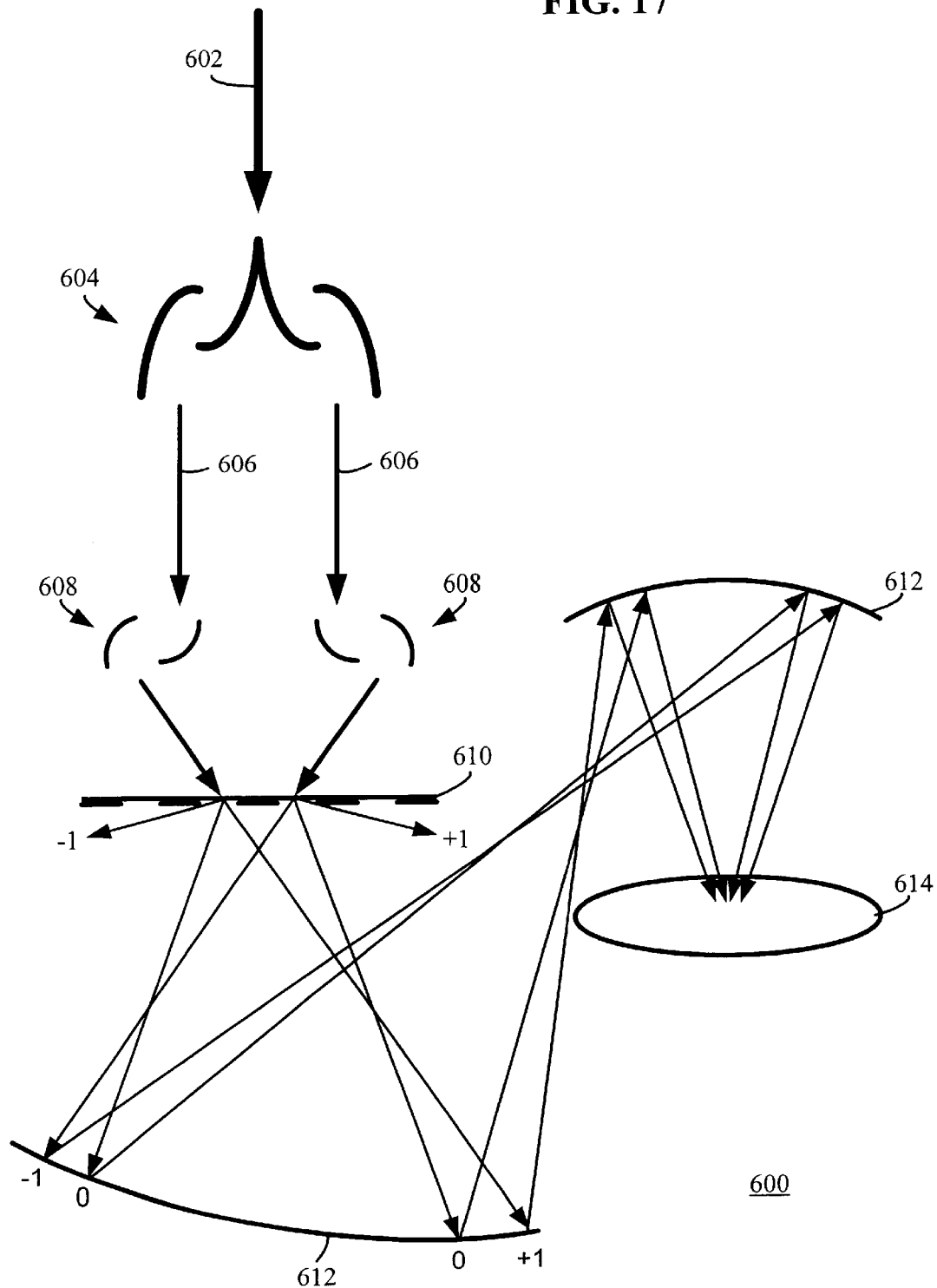
FIG. 17 is a diagram illustrating a lithographic exposure system.

Referring to FIG. 17, a lithographic exposure system 600 for illuminating a substrate wafer using deep-ultraviolet or EULV with a reflective illumination shaping device is shown, though the claimed invention may be applicable to exposure systems utilizing other wavelengths. Input light 602 having a generally monopole, on-axis illumination pattern is incident on an illumination shaping device 604. In a manner similar to those described above, the illumination shaping device 604 reflects the input light 602 to create output light 606 having an off-axis, non-monopole illumination pattern, generally of the annular (single or concentric rings) or the multipole variety.

A condenser system including a first series of mirrors 608 (collectively referred to as condenser mirrors 608) may be included to redirect the output light 606 to illuminate a design pattern on a reticle 610 at an angle to the optical axis. The condenser mirrors 608 are generally used instead of the lenses commonly used with other lithographic exposure systems, because of the drawbacks described above with respect to the use of lenses with EUVL. However, other ways of illuminating the reticle 610 at an angle to the optical axis may be used, in addition to or as an alternative to redirection reflectors 608. For example, as described above with respect to FIG. 16, the paraboloid sections of the reflecting objectives may be pitched forward or backward, while maintaining focal point alignment. By pitching the paraboloid sections of the output reflecting objective forward, the output light 606 is directed to converge towards the optical axis and illuminate the reticle 610 at an angle to the optical axis. Alternatively, the condenser system may include a condenser lens that may be used to direct the output light 606 onto the reticle 610 for some wavelengths in the deep ultraviolet spectrum without incurring the drawbacks associated with EUVL, though the condenser mirrors 608 may still be used with deep ultraviolet lithography.

The reticle 610 generates diffraction images symmetrical about the optical axis from the illumination of the output light 606. A second series of mirrors 612 (collectively referred to as projection mirrors 612), or other reflective projection system, focus the diffracted image onto a substrate wafer 614. The projection mirrors 612 capture and focus the non-diffracted order (i.e., $0^{th}$ order) and at least one of the higher diffraction orders (e.g., $\pm 1^{st}$ orders) from each diffracted beam of the output light 606 in order to resolve the image on the substrate wafer 614. In order to compensate for any shift in the image on the substrate wafer 614, the projection system captures and reflects diffraction orders that are symmetrical to each other about the optical axis. That is, for each non-diffracted order and a higher diffraction order of a particular beam (e.g., $0^{th}$ and $+1^{st}$ orders), the non-diffracted order and a higher diffraction order of a beam (e.g., $0^{th}$ and $-1$ orders) symmetrical to the first beam are also captured and reflected by the projection mirrors 612. Other projection systems may be able to capture more than the first order of the higher diffraction orders. As with the condenser mirrors 608 above, the projection mirrors 612 are used to accommodate wavelengths used with EUVL. However, with deep ultraviolet lithography wavelengths, a projection lens may be used without the drawbacks associated with EUVL.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A lithographic illumination shaping device comprising:
    a first reflecting objective including an input end arranged to accept input light having an on-axis illumination pattern, the first reflecting objective further including a first reflective surface having a first focal point, the first reflective surface is arranged to reflect the input light through the first focal point; and
    a second reflecting objective including an output end, the second reflecting objective further including a second reflective surface with a second focal point aligned with the first focal point, the second reflective surface arranged to receive the input light from the first reflective surface through the first and second focal points, and further arranged to reflect the input light through the output end as output light having an off-axis illumination pattern.

2. A lithographic illumination shaping device as described in claim 1, wherein the output light has a substantially off-axis, radially symmetrical illumination pattern.

3. A lithographic illumination shaping device as described in claim 1, wherein the output light has a substantially off-axis, asymmetrical illumination pattern, wherein the asymmetry is with respect to at least one of intensity and shape.

4. A lithographic illumination shaping device as described in claim 1, wherein the on-axis illumination pattern comprises a conventional illumination pattern and the off-axis illumination pattern comprises at least one of an annular illumination pattern, a concentric annular illumination pattern and a multipole illumination pattern.

5. A lithographic illumination shaping device as described in claim 1, wherein the first reflecting objective comprises a first plurality of off-axis paraboloid sections each having a reflective surface with a first focal point and the second reflecting objective comprises a second plurality of off-axis paraboloid sections each having a reflective surface with a second focal point aligned with a first focal point of one of the first plurality of off-axis paraboloid sections.

6. A lithographic illumination shaping device as described in claim 5, wherein the first reflecting objective comprises an infinite number of the off-axis paraboloid sections and the plurality of first focal points comprise a first focal ring, and wherein the second reflecting objective comprises an infinite number of the off-axis paraboloid sections and the plurality of second focal points comprise a second focal ring aligned with the first focal ring.

7. A lithographic illumination shaping device as described in claim 5, wherein the first and second reflecting objectives each comprise two paraboloid sections.

8. A lithographic illumination shaping device as described in claim 5, wherein the first and second reflecting objectives each comprise four paraboloid sections.

9. A lithographic illumination shaping device as described in claim 5, wherein the paraboloid sections of the first reflecting objective comprise the same curvature as the paraboloid sections of the second reflecting objective.

10. A lithographic illumination shaping device as described in claim 5, wherein the paraboloid sections of the first reflecting objective comprise a different curvature than the paraboloid sections of the second reflecting objective.

11. A lithographic illumination shaping device as described in claim 1, wherein the first and second reflecting objectives are centered on an optical axis of a lithography system and wherein the first and second reflecting objectives are arranged symmetrically about the optical axis.

12. A lithographic illumination shaping device as described in claim 1, wherein the first reflective surface comprises two or more first principal axes and the second reflective surface comprises two or more second principal axes, and wherein at least one of the first principal axes and at least of the second principal axes are coaxial.

13. A lithographic illumination shaping device as described in claim 1, wherein the first reflective surface comprises a two or more first principal axes and the second reflective surface comprises two or more second principal axes, wherein the first at least one of the first principal axes is at an angle to at least one of the second principal axes.

14. A lithographic illumination shaping device as described in claim 1, wherein the first and second reflective surfaces are arranged to reflect light comprising wavelengths below 248 nanometers.

15. A lithographic illumination shaping device as described in claim 1, wherein the first and second reflective surfaces are arranged to reflect light comprising wavelengths between 8 nanometers and 193 nanometers.

16. A lithographic illumination shaping device as described in claim 1, wherein the first and second reflective surfaces are arranged to reflect light comprising a wavelength of at least one of approximately 248 nanometers, approximately 193 nanometers, approximately 157 nanometers and approximately 13 nanometers.

17. A lithographic illumination shaping device as described in claim 1, wherein the first and second reflective surfaces are arranged to reflect at least one of deep ultraviolet illumination and extreme ultraviolet illumination.

18. A lithographic illumination shaping device as described in claim 1, wherein the first and second reflective surfaces comprise at least one of fused silicon impregnated with fluorine, calcium fluoride and molybdenum.

19. A method of off-axis lithographic illumination comprising:
   receiving collimated light having a conventional illumination pattern centered on an optical axis of a lithographic exposure system;
   reflecting the collimated light in two or more directions away from the optical axis to create reflected light, wherein the collimated light is reflected symmetrically about the optical axis; and
   reflecting the reflected light to create output light having an off-axis illumination pattern symmetrical about the optical axis.

20. A method of off-axis illumination as described in claim 19, wherein reflecting the collimated light comprises reflecting the collimated light through two or more focal points of two or more paraboloid sections having reflective surfaces, and wherein reflecting the collimated light is performed by the two or more paraboloid sections.

21. A method of off-axis illumination as described in claim 19, wherein reflecting the reflected light comprises receiving the reflected light through two or more focal points of two or more paraboloid sections having reflective surfaces, and wherein reflecting the reflected light is performed by the two or more paraboloid sections.

22. A method of off-axis illumination as described in claim 19, wherein reflecting the reflected light comprises reflecting the reflected light to create output light having at least one of an off-axis dipole illumination pattern, an off-axis quadrapole illumination pattern, an off-axis annular illumination pattern, and an off-axis concentric ring illumination pattern, wherein each illumination pattern is symmetrical about the optical axis.

23. A method of off-axis illumination as described in claim 19, wherein reflecting the reflected light comprises reflecting the reflected light to at least one of: converge on the optical axis, diverge from the optical axis, or propagate parallel to the optical axis.

24. A method of off-axis illumination as described in claim 19, wherein reflecting the reflected light comprises collimating the reflected light.

25. A method of off-axis illumination as described in claim 19 further comprising:
   illuminating a reticle with the output light at an angle to the optical axis to create diffracted light;
   projecting at least a first non-diffracted order and a first higher diffraction order of the diffracted light onto a substrate wafer to create a first image; and
   projecting at least a second non-diffracted order and a second higher diffraction order of the diffracted light onto a substrate wafer to create a second image symmetrical to the first image.

26. A lithographic exposure system having an optical axis, the system comprising:
   an illumination source arranged to produce collimated light having a conventional illumination pattern centered on the optical axis;
   a reflective illumination shaping device arranged to accept the collimated light, the reflective illumination shaping device including:
     a first reflecting objective having a plurality of first paraboloid reflective surfaces each having a first focal point, the plurality of first paraboloid reflective surfaces being symmetrically arranged about the optical axis, wherein the first reflective objective is arranged to uniformly reflect the collimated light off each first paraboloid reflective surface and through the first focal point of each first paraboloid reflective surface to create reflected light; and
     a second reflecting objective having a plurality of second paraboloid reflective surfaces each having a second focal point aligned with a first focal point of a corresponding first paraboloid reflective surface, the plurality of second paraboloid reflective surfaces being symmetrically arranged about the optical axis, wherein the second reflective objective is arranged to uniformly receive the reflected light from the first reflecting objective through the second focal points and reflect the reflected light to create output light having an off-axis illumination pattern symmetrically arranged about the optical axis;

a reticle arranged to diffract the output light into at least a first and second non-diffracted order symmetrically arranged about the optical axis, and a first and second higher diffraction order symmetrically arranged about the optical axis; and a projection system arranged to focus the first and second non-diffracted orders and the first and second higher diffraction orders onto a substrate wafer, wherein the projection system comprises at least one of a mirror and a lens.

27. A lithographic exposure system as described in claim 26, wherein the off-axis illumination pattern comprises at least one of an annular illumination pattern, a concentric annular illumination pattern and a multipole illumination pattern.

28. A lithographic exposure system as described in claim 26, wherein the second reflecting objective is arranged to symmetrically project the output light onto the reticle at an angle to the optical axis.

29. A lithographic exposure system as described in claim 26 further comprising a condenser system arranged to symmetrically redirect the output light onto the reticle at an angle to the optical axis, wherein the condenser system comprises at least one of a mirror and a lens.

30. A lithographic exposure system as described in claim 26, wherein the first and second plurality of reflective paraboloid surfaces are arranged to reflect at least one of deep ultraviolet illumination and extreme ultraviolet illumination.

* * * * *

UNITED STATES PATENT AND TRADEMARK OFFICE
CERTIFICATE OF CORRECTION

PATENT NO. : 6,703,625 B1  Page 1 of 1
DATED : March 9, 2004
INVENTOR(S) : Theodore G. Doros It is certified that error appears in the above-identified patent and that said Letters Patent is hereby corrected as shown below:

<u>Title page,</u>
Item [57], ABSTRACT,
Line 10, after "reflected light through," please delete "an output end as output light having."

Signed and Sealed this

Twenty-ninth Day of June, 2004

JON W. DUDAS
*Acting Director of the United States Patent and Trademark Office*